United States Patent
Uesugi

[11] Patent Number: 6,100,832
[45] Date of Patent: Aug. 8, 2000

[54] A/D CONVERSION APPARATUS HAVING HIGH LEVEL RECEPTION ENHANCEMENT

[75] Inventor: Mitsuru Uesugi, Yokohama, Japan

[73] Assignee: Matsushita Electric Industrial Co., Ltd., Osaka, Japan

[21] Appl. No.: 09/015,404

[22] Filed: Jan. 29, 1998

[30] Foreign Application Priority Data

Jan. 30, 1997 [JP] Japan ................... 9-016348

[51] Int. Cl.[7] .............. H03M 1/62; H03M 1/06
[52] U.S. Cl. ............................ 341/139; 341/118
[58] Field of Search ..................... 341/139, 118, 341/150, 120; 327/315, 331, 354, 361

[56] References Cited

U.S. PATENT DOCUMENTS

| | | | |
|---|---|---|---|
| 4,823,129 | 4/1989 | Nelson | 341/139 |
| 5,202,686 | 4/1993 | Rapp et al. | 341/139 |
| 5,250,948 | 10/1993 | Berstein et al. | 341/131 |
| 5,805,090 | 9/1998 | Sato | 341/116 |

FOREIGN PATENT DOCUMENTS

7336224A  12/1995  Japan.

*Primary Examiner*—Brian Young
*Assistant Examiner*—Patrick Wamsley
*Attorney, Agent, or Firm*—Stevens, Davis, Miller & Mosher, L.L.P.

[57] ABSTRACT

A plurality of amplifiers having different amplification factors are provided and a received signals and amplified output signal are all sampled by A/D converters. A selector selects, from the sampled signal, a signal from which accuracy can be attained exceedingly and is not saturated upon sampling, so that there can be provided an A/D conversion apparatus which does not require AGC control and conversion calculation of data and can obtain desired accuracy. Selection logic can use comparison of maximum values and logical sums of absolute values of the sampled values, levels which are not amplified or the like.

6 Claims, 6 Drawing Sheets

A/D CONVERSION APPARATUS HAVING HIGH LEVEL RECEPTION ENHANCEMENT

BACKGROUND OF THE INVENTION

The present invention relates to an A/D conversion apparatus capable of performing A/D conversion with a reduced number of bits to obtain desired reception performance even if a level of a received signal varies greatly as in the mobile communication.

When digital signals are transmitted, it has been proposed that various processings such as equalization, RAKE receiving, removal of interference, detection of synchronization and the like are performed in the receiver side in order to improve the transmission quality. Most of them are effected by processing of signals, while it is often premised that the received signal is linearly received in order to improve the performance. On the other hand, in order to process the signal, it is necessary to sample the received signal by an AID converter, while the number of bits of the A/D converter is directly related to a cost thereof and accordingly it is impossible to increase the number of bits of the A/D converter. On the contrary, when the number of bits is small, satisfactory receiving performance is not obtained because of variation of the level due to the fading.

Accordingly, heretofore, two kinds of A/D conversion apparatuses have been developed in order to cope with a large dynamic range of the received signal. One of them uses an AGC amplifier to control an amplification factor at the preceding stage of the A/D conversion to absorb the dynamic range. The other converts amplitude information into logarithmic information to be A/D converted and samples phase information separately to thereby reproduce an original received signal from a combination of amplitude and phase information. The two kinds of conventional A/D conversion apparatuses are now described.

Figure 6:
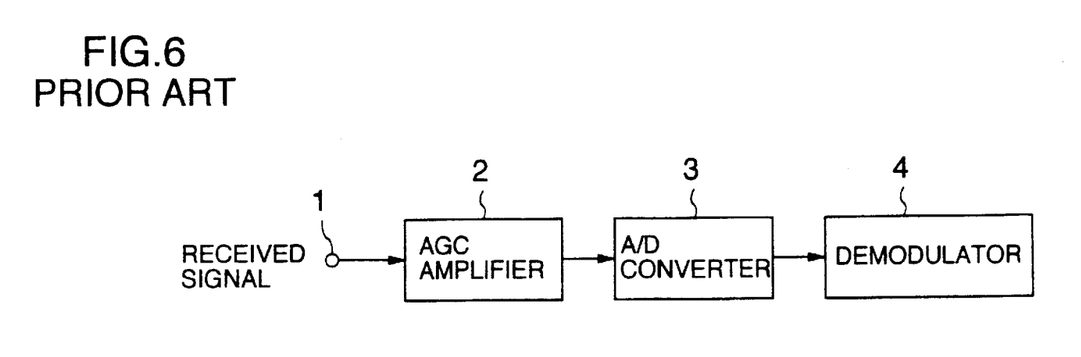
FIG. 6 is a block diagram schematically illustrating an example of a conventional A/D conversion apparatus.

FIG. 6 schematically illustrates a conventional A/D conversion apparatus using an AGC amplifier. In FIG. 6. numeral 1 denotes a received signal, which is supplied through an AGC amplifier 2 and an A/D converter 3 to a demodulator 4. The AGC amplifier 2 changes its amplification factor in accordance with a level of the received signal 1 so that a dynamic range thereof is not increased excessively at an input of the A/D converter 3. Accordingly, even when the number of bits of the A/D converter 3 is small, the satisfactory demodulation performance is obtained in the demodulator 4.

Figure 7:
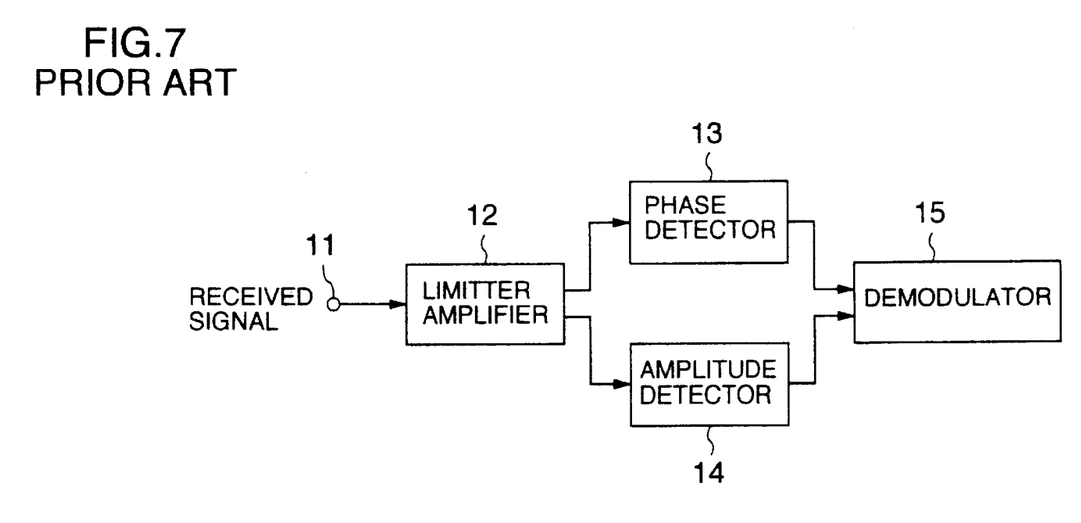
FIG. 7 is a block diagram schematically illustrating another example of a conventional AID conversion apparatus.

FIG. 7 schematically illustrates another conventional A/D conversion apparatus in which a received signal is converted into a logarithmic signal to be sampled. In FIG. 7, numeral 11 denotes a received signal, which is supplied through a limiter amplifier 12, a phase detector 13 and an amplitude detector 14 to a demodulator 15. The limiter amplifier 12 is an amplifier which shapes the received signal 11 into a signal having a fixed amplitude regardless of an amplitude of the received signal 11 and an output signal of the limiter amplifier 12 lacks amplitude information but holds phase information. Accordingly, the phase can be obtained in the phase detector 13. On the other hand, the limiter amplifier 12 separately outputs a substantially logarithmic signal of an amplitude thereof and the signal is sampled by the amplitude detector (which may be a usual A/D converter). Since the amplitude is converted into the logarithmic signal, desired accuracy is obtained by the A/D converter with a reduced number of bits even if the dynamic range of the received signal is wide. Finally, the demodulator 15 reproduces the received signal 11 from the sampled value by the phase detector 13 and the sampled value by the amplitude detector 14 accurately and performs demodulation by using the reproduced result to thereby attain satisfactory demodulation performance.

In the method using the AGC amplifier, a loop by an analog signal or digital control is known as control of the amplification factor. However, any control method cannot control a suddenly produced burst signal sufficiently and an optimum solution of a control method such as a detection method of a level and a time constant of a feedback signal is different depending on the fading pitch or a state of lines. Accordingly, there is a problem that it is difficult to attain a desired operation under all conditions and a number of analog circuits are required.

Further, in the method in which the received level is converted into the logarithmic level to be sampled, the phase information and the amplitude information are obtained, while a large amount of calculations are required to reproduce the original signal from the phase and amplitude information and there is a tendency that a time difference occurs between the phase information and the amplitude information. Particularly, when a symbol rate is large, deterioration tends to occur.

SUMMARY OF THE INVENTION

In order to solve the above problems, according to the present invention, a plurality of amplifiers having a plurality of amplification factors are provided in parallel to each other and a signal from which demodulation performance is drawn out most satisfactorily is selected after sampling of each signal. In the selection logic, for example, a signal having a most significant bit in which data is set as far as A/D converters are not saturated is selected. Consequently, a sampled data from which the demodulation performance is drawn out most satisfactorily can be selected even for a suddenly produced burst signal or even for data of any line condition. Further, the selected data can be used for processing of signals as it is and it is not necessary to convert the data. Furthermore, since the conversion is not required, there is no deterioration such as occurrence of time difference between phase information and amplitude information. In addition, the A/D converters can be used in the time division manner to thereby suppress the circuit scale.

According to the present invention, the A/D conversion apparatus comprises a plurality of amplifiers for amplifying a received signal with different amplification factors, a plurality of A/D converters for A/D converting amplified signals and the received signal, a selector for selecting a signal from which accuracy can be attained exceedingly, from sampled signals upon the A/D conversion, and a demodulator for demodulating the selected signal, whereby even if a level of the received signal is varied largely, desired receiving performance is obtained.

According to the present invention, the A/D conversion apparatus comprises maximum value detectors and buffers connected in parallel to each other between the A/D converters and the selector, whereby a sampled signal selected by the selector is determined from A/D converted maximum values and even if a level of the received signal is varied largely, desired receiving performance is obtained.

According to the present invention, the A/D conversion apparatus comprises absolute value calculators and logical sum calculators connected in series to each other between the A/D converters and the selector and buffers connected in parallel to the series connection circuit, whereby the sampled signal selected by the selectors is determined from logical sums of absolute values of the A/D converted signals and even if a level of the received signal is varied largely, desired receiving performance is obtained.

According to the present invention, the A/D conversion apparatus (according to claim 1) comprises amplitude comparators connected in parallel to the A/D converters and buffers connected between the A/D converters and the selector, whereby the sampled signal selected by the selector is determined from levels of signals which are not A/D converted and even if a level of the received signal is varied largely, desired receiving performance is obtained.

According to the present invention, the A/D conversion apparatus comprises a plurality of amplifiers for amplifying a received signal with different amplification factor, one or a few A/D converters for A/D converting amplified signals and the received signal while changing over the amplified signals and the received signal by means of an analog switch, a plurality of buffers for temporarily storing the A/D converted signals while changing over the A/D converted signals by means of a digital switch, a selector for selecting a signal from which demodulation performance is obtained most satisfactorily, from signals produced from the buffers, and a demodulator for demodulating the selected signals, whereby even if a level of the received signal is varied largely, desired receiving performance is obtained.

DESCRIPTION OF THE PREFERRED EMBODIMENTS

Embodiments of the present invention are now described with reference to FIGS. 1, 2, 3, 4 and 5.
(Embodiment 1)

Figure 1:
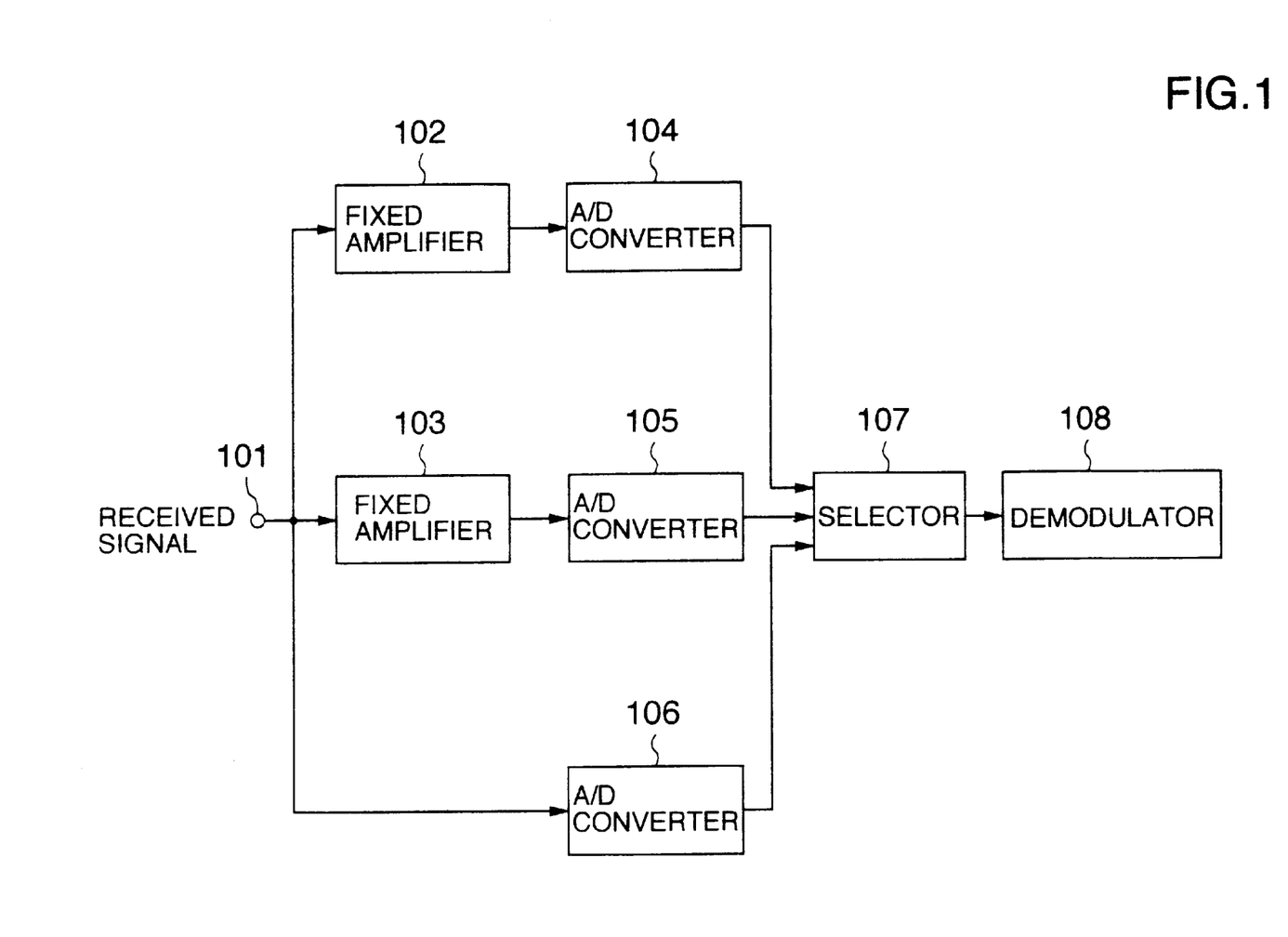
FIG. 1 is a block diagram schematically illustrating an A/D conversion apparatus according to a first embodiment of the present invention.

FIG. 1 schematically illustrates an A/D conversion apparatus according to a first embodiment of the present invention. In FIG. 1, numeral 101 denotes a received signal, 102 and 103 fixed amplifiers for amplifying the received signal 101 with different amplification factors, respectively, 104, 105 and 106 A/D converters for converting output signals amplified by the amplifiers 102, 103 and the received signal 101 into digital signals, respectively, 107 a selector for selecting a signal from which accuracy can be attained exceedingly from sampled signals upon the A/D conversion, and 108 a demodulator for performing demodulation by using the signal selected by the selector 107.

Operation of the first embodiment is now described. The received signal 101 is amplified by the fixed amplifiers 102 and 103 with the different amplification factors, respectively, and the amplified analog signals are converted into digital signals by the A/D converters 104, 105. Further, the received signal 101 is also supplied directly to the A/D converter 106 to be converted into a digital signal. Of the A/D converted signals, a signal from which accuracy can be attained exceedingly and which is not saturated upon sampling in the A/D converters is selected by the selector 107 and the selected signal is demodulated by the demodulator 108.

In the first embodiment, the received signal 101 is converted into three kinds of different levels by way of example, while the number of levels is not limited thereto and any number of levels may be used. For example, it is assumed that the fixed amplifier 102 has the amplification factor of 40 dB and the fixed amplifier 103 has the amplification factor of 20 dB. When the received signal 101 has a large level, the A/D converters 104 and 105 are saturated, so that the satisfactory receiving performance cannot be obtained even if the amplifiers having the above data are used, while since the A/D converter 106 samples the signal which is not amplified, the satisfactory receiving performance is obtained without saturation. On the contrary, when the received signal 101 has a small level, the A/D converters 105 and 106 are not saturated but cannot obtain the satisfactory demodulation performance since a quantized error is too large, while the A/D converter 104 can sample the signal with satisfactory accuracy, so that the satisfactory demodulation performance is obtained since the quantized error is small. When the received signal 101 has an intermediate level between the above two levels, the sampled signal by the A/D converter 105 becomes an optimum signal. The selector 107 selects the sampled signal from which the demodulation performance is judged to be drawn out most satisfactorily and supplies the signal to the demodulator 108 which demodulates the signal.

In the first embodiment, since the two amplifiers 102 and 103 are used and the amplification factors thereof are changed by 20 dB, the embodiment can cope with the dynamic range of 60 dB as a whole. In the case of a single A/D converter, 10 bits are required excessively as compared with a necessary number of bits in order for attaining the demodulation performance, while the A/D converters of the embodiment may be operated satisfactorily if the dynamic range of 20 dB is provided for each A/D converter, that is, if the A/D converter provides four bits excessively.

As described above, according to the first embodiment, the received signal is amplified by the plurality of amplifiers having different amplification factors and the amplified signals and the received signal are converted into the digital signals. The signal from which accuracy can be attained exceedingly is selected from the sampled signals. Accordingly, even if the level of the received signal is varied largely, the desired receiving performance can be obtained.
(Embodiment 2)

Figure 2:
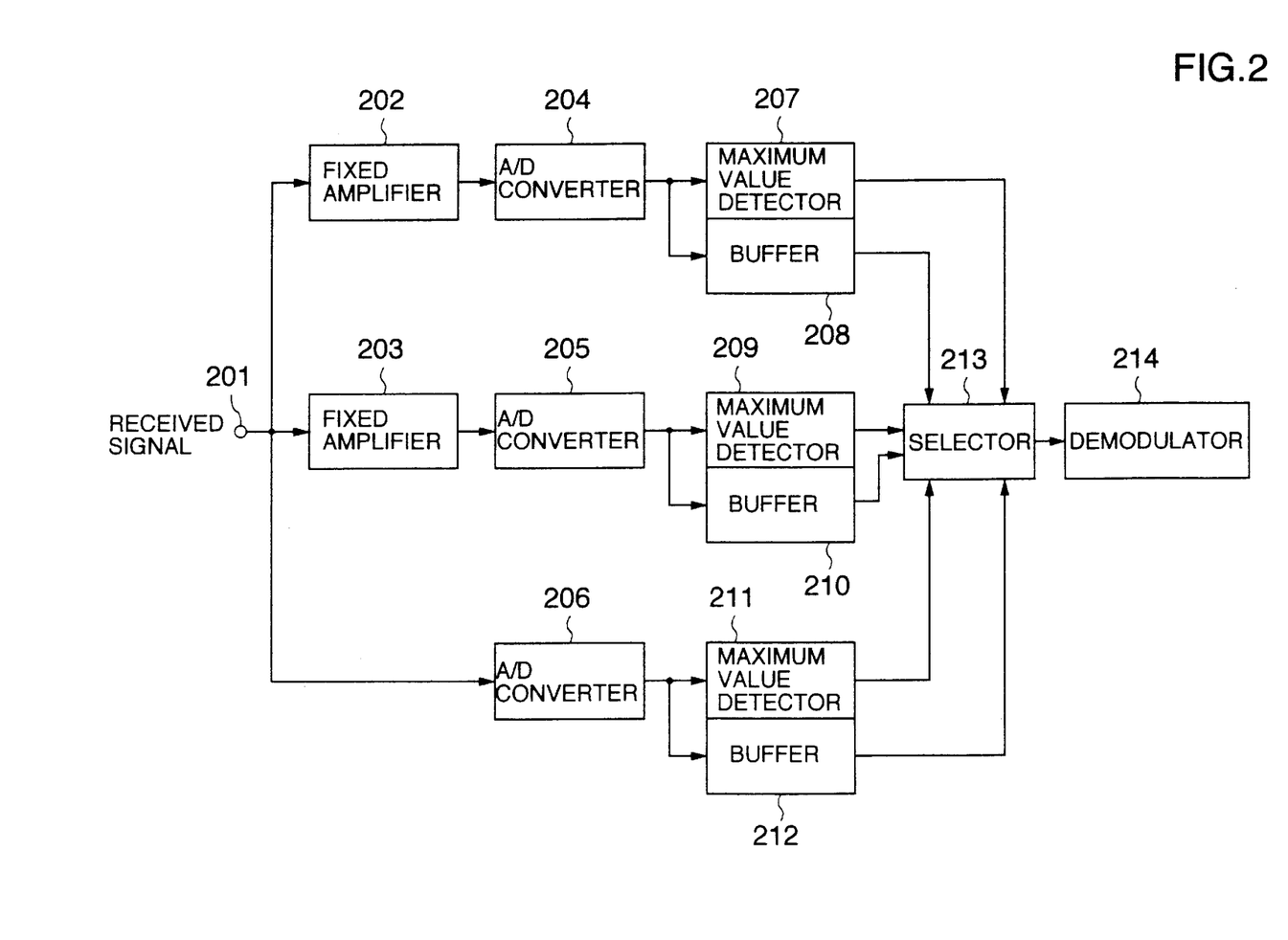
FIG. 2 is a block diagram schematically illustrating an A/D conversion apparatus according to a second embodiment of the present invention.

FIG. 2 schematically illustrates an A/D conversion apparatus according to a second embodiment of the present invention. In FIG. 2, numeral 201 denotes a received signal, 202 and 203 fixed amplifiers for amplifying the received signal 201 with different amplification factors, respectively, 204, 205 and 206 A/D converters for converting the amplified analog output signals and the received analog signal 201 into digital signals, 207, 209 and 211 maximum value detectors each detecting a signal having a maximum value, of the output signals of the A/D converters 204, 205 and 206, respectively, 208, 210, 212 buffers for temporarily storing the output signals of the A/D converters 204, 205 and 206, respectively, 213 a selector for selecting a signal having a maximum value from output signals of the maximum value detectors 207, 209 and 211 and the buffers 208, 210 and 212, and 214 a demodulator for performing demodulation by using the signal selected by the selector 213.

Operation of the second embodiment is now described. The second embodiment is different from the first embodiment shown in FIG. 1 in that the maximum value detectors 207, 209 and 211 and the buffers 208, 210 and 211 are connected in parallel to each other between the A/D converters 204, 205 and 206 and the selector 213, and the operation of the second embodiment is the same as the first embodiment except that the sampled signal selected by the selector 213 is determined from the signals having the maximum values after the A/D conversion.

In the second embodiment, the received signal 201 is converted into three kinds of different levels by way of example, while the number of levels is not limited thereto and any number of levels may be used. For example, it is assumed that the fixed amplifier 202 has the amplification factor of 40 dB and the fixed amplifier 203 has the amplification factor of 20 dB. When the received signal 201 has a large level, the A/D converters 204 and 205 are saturated, so that the satisfactory receiving performance cannot be obtained even if the amplifiers having the above data are used, while since the A/D converter 206 samples the signal which is not amplified, the satisfactory receiving performance is obtained without saturation. On the contrary, when the received signal 201 has a small level, the A/D converters 205 and 206 are not saturated but cannot obtain the satisfactory demodulation performance since a quantized error is too large, while the A/D converter 204 can samples the signal with satisfactory accuracy, so that the satisfactory demodulation performance is obtained since the quantized error is small. When the received signal 201 has an intermediate level between the above two levels, the sampled signal by the A/D converter 205 becomes an optimum signal.

In order to enable the selector 213 to select such an optimum signal, the output signals of the A/D converters 204, 205 and 206 are once stored in the buffers 208, 210 and 212, respectively, and at the same time the maximum value detectors 207, 209 and 211 detect the A/D converted signals having the maximum values, respectively. Since whether the signals are saturated or not is understood by examining the maximum values, the selector 213 can perform correct selection.

As described above, according to the second embodiment, since the sampled signal selected by the selector 213 is determined from the A/D converted signals having the maximum values, the desired receiving performance can be obtained even if the level of the received signal is varied largely.

(Embodiment 3)

Figure 3:
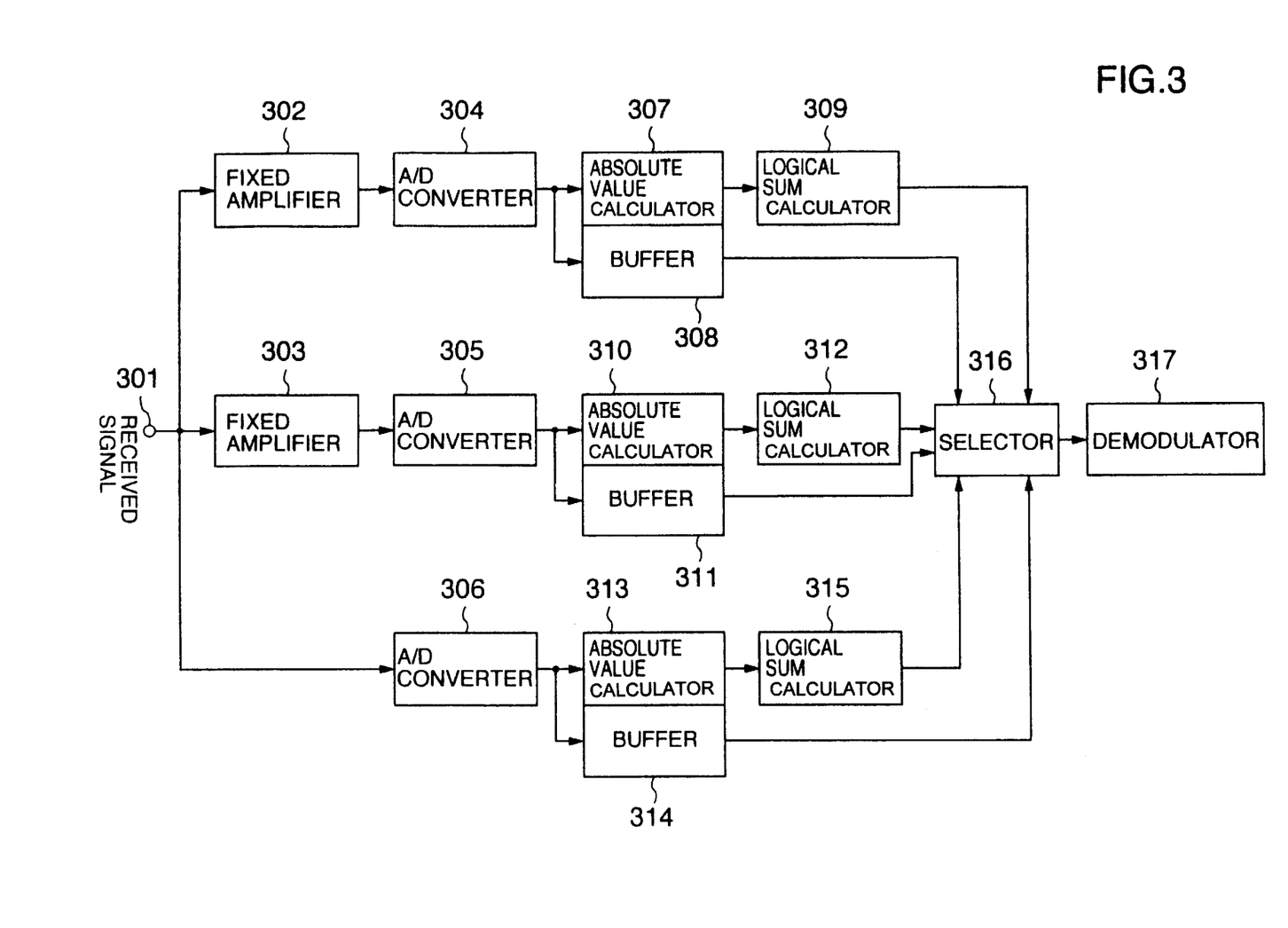
FIG. 3 is a block diagram schematically illustrating an A/D conversion apparatus according to a third embodiment of the present invention.

FIG. 3 schematically illustrates an A/D conversion apparatus according to a third embodiment of the present invention. In FIG. 3, numeral 301 denotes a received signal, 302 and 303 fixed amplifiers for amplifying the received signal 301 with different amplification factors, respectively, 304, 305 and 306 A/D converters for converting the amplified analog output signals and the received analog signal 301 into digital signals, 307, 310 and 313 absolute value calculators for calculating absolute values of output signals of the A/D converters 304, 305 and 306, respectively, 309, 312 and 315 logical sum calculators for calculating logical sums of output signals of the absolute value calculators 307, 310 and 313, respectively, 308, 311 and 314 buffers for temporarily storing the output signals of the A/D converters 304, 305 and 306, respectively, 316 a selector for selecting, from output signals of the logical sum calculators 309, 312 and 315 and the buffers 308, 311 and 314, a signal from which the demodulation performance can be drawn out most satisfactorily after the A/D conversion, and 317 a demodulator for performing demodulation by using the signal selected by the selector 316.

Operation of the third embodiment is now described. The third embodiment is different from the first embodiment shown in FIG. 1 in that the absolute value calculators 307, 310 and 313 and the logical sum calculators 309, 312 and 315 are connected in series between the A/D converters 304, 305 and 306 and the selector 316, respectively, and the buffers 308, 311 and 314 are connected in parallel to the series connection circuits. Accordingly, the operation of the third embodiment is the same as the first embodiment except that the sampled signal selected by the selector 316 is determined from the logical sums of the A/D converted absolute values.

In the third embodiment, the received signal 301 is converted into three kinds of different levels by way of example, while the number of levels is not limited thereto and any number of levels may be used. For example, it is assumed that the fixed amplifier 302 has the amplification factor of 40 dB and the fixed amplifier 303 has the amplification factor of 20 dB. When the received signal 301 has a large level, the A/D converters 304 and 305 are saturated, so that the satisfactory receiving performance cannot be obtained even if the amplifiers having the above data are used, while since the A/D converter 306 samples the signal which is not amplified, the satisfactory receiving performance is obtained without saturation. On the contrary, when the received signal 301 has a small level, the A/D converters 305 and 306 are not saturated but cannot obtain the satisfactory demodulation performance since a quantized error is too large, while the A/D converter 304 can samples the signal with satisfactory accuracy, so that the satisfactory demodulation performance is obtained since the quantized error is small. When the received signal 301 has an intermediate level between the above two levels, the sampled signal by the A/D converter 305 becomes an optimum signal.

In order to enable the selector 313 to select such an optimum signal, the output signals of the A/D converters 304, 305 and 306 are once stored in the buffers 308, 311 and 314, respectively, and at the same time the absolute value calculators 307, 310 and 313 calculate maximum values of the A/D converted signals, respectively. Further, the logical sum calculators 309, 312 and 315 calculate logical sums of the maximum values. Since whether the signals are saturated or not is understood by examining whether 1 is set in the logical sums or not, the selector 316 can perform correct selection.

As described above, according to the third embodiment, since the sampled signal selected by the selector 316 is determined on the basis of the logical sums of the absolute values of the A/D converted signals, the desired receiving performance can be obtained even if the level of the received signal is varied largely.

(Embodiment 4)

Figure 4:
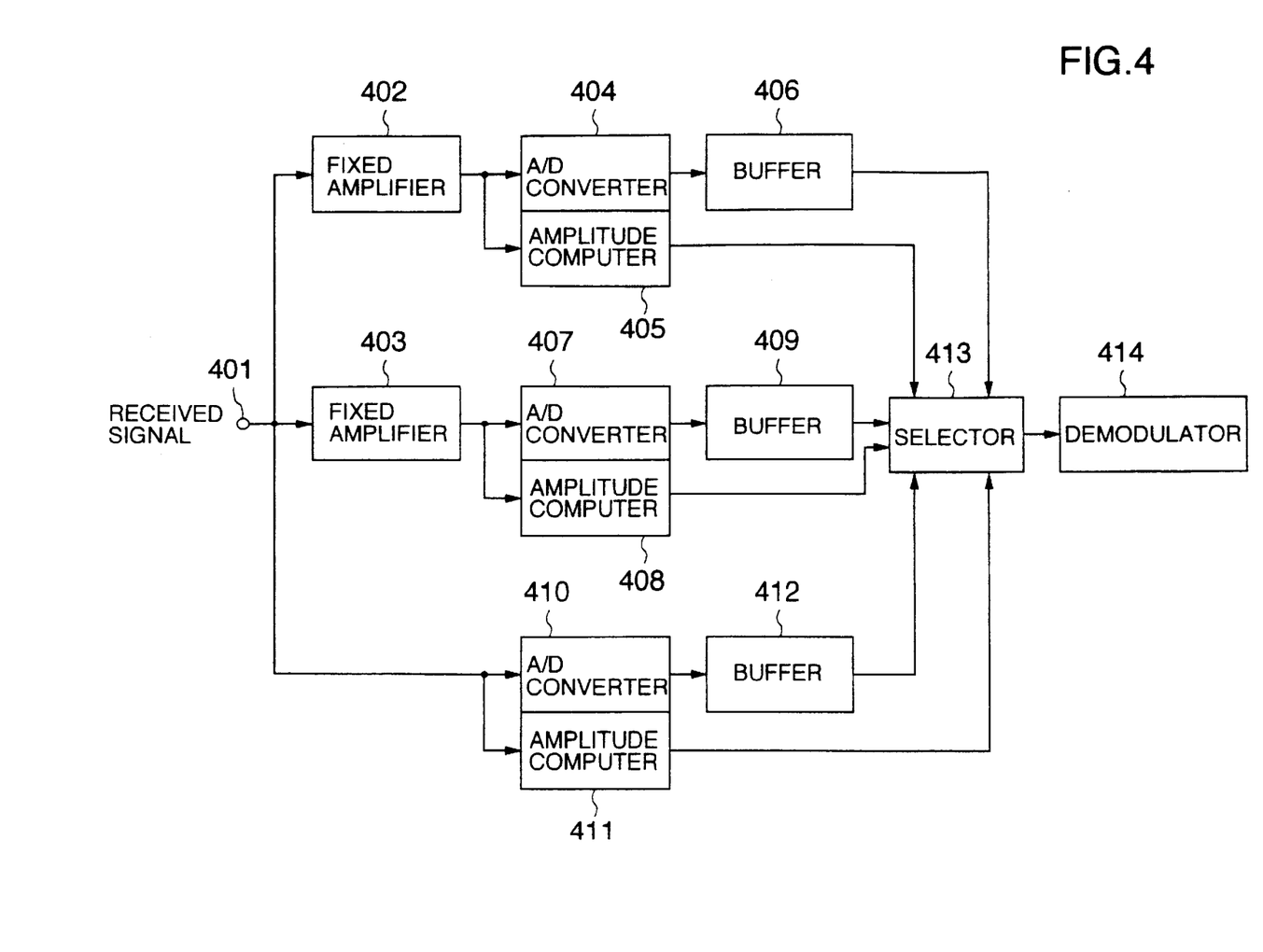
FIG. 4 is a block diagram schematically illustrating an A/D conversion apparatus according to a fourth embodiment of the present invention.

FIG. 4 schematically illustrates an A/D conversion apparatus according to a fourth embodiment of the present invention. In FIG. 4, numeral 401 denotes a received signal, 402 and 403 fixed amplifiers for amplifying the received signal 401 with different amplification factors, respectively, 404, 407 and 410 A/D converters for converting amplified analog output signals and the received analog signal into digital signals, 405, 408 and 411 amplitude comparators for detecting output signal levels of the fixed amplifiers 402 and 403 and a signal level of the received signal 401, respectively, 406, 409 and 412 buffers for temporarily storing digital output signals of the A/D converters 404, 407 and 410, respectively, 413 a selector for selecting, from output signals of the amplitude comparators 405, 408 and 411 and the buffers 406, 409 and 412, a signal from which the demodulation performance can be drawn out most satisfactorily after the A/D conversion, and 414 a demodulator for performing demodulation by using the signal selected by the selector 413.

Operation of the fourth embodiment is now described. The fourth embodiment is different from the first embodiment shown in FIG. 1 in that the amplitude comparators 405, 408 and 411 are connected in parallel to the A/D converters 404, 407 and 410, and the buffers 406, 409 and 412 are connected between the A/D converters 404, 407 and 410 and the selector 413, respectively. Accordingly, the operation thereof is the same as the first embodiment except that the sampled signal selected by the selector 413 is determined from levels of signals which are not converted into digital signals.

In the fourth embodiment, the received signal 401 is converted into three kinds of different levels by way of example, while the number of levels is not limited thereto and any number of levels may be used. For example, it is assumed that the fixed amplifier 402 has the amplification factor of 40 dB and the fixed amplifier 403 has the amplification factor of 20 dB. When the received signal 401 has a large level, the A/D converters 404 and 407 are saturated, so that the satisfactory receiving performance cannot be obtained even if the amplifiers having the above data are used, while since the A/D converter 410 samples the signal which is not amplified, the satisfactory receiving performance is obtained without saturation. On the contrary, when the received signal 401 has a small level, the A/D converters 407 and 410 are not saturated but cannot obtain the satisfactory demodulation performance since a quantized error is too large, while the A/D converter 404 can sample the signal with satisfactory accuracy, so that the satisfactory demodulation performance is obtained since the quantized error is small. When the received signal 401 has an intermediate level between the above two levels, the sampled signal by the A/D converter 407 becomes an optimum signal.

In order to enable the selector 413 to select such an optimum signal, the output signals of the A/D converters 404, 407 and 410 are once stored in the buffers 406, 409 and 412, respectively, and at the same time the amplitude comparators 405, 408 and 411 compare the amplitudes upon the A/D conversion with a reference level to examine the probabilities that the amplitudes exceed the reference level. Since whether the signals are saturated or not is understood by examining the probabilities, the selector 413 can perform correct selection.

As described above, according to the fourth embodiment, since the sampled signal selected by the selector 413 is determined on the basis of the levels of the signals which are not converted into the digital signals, the desired receiving performance can be obtained even if the level of the received signal is varied largely.

(Embodiment 5)

Figure 5:
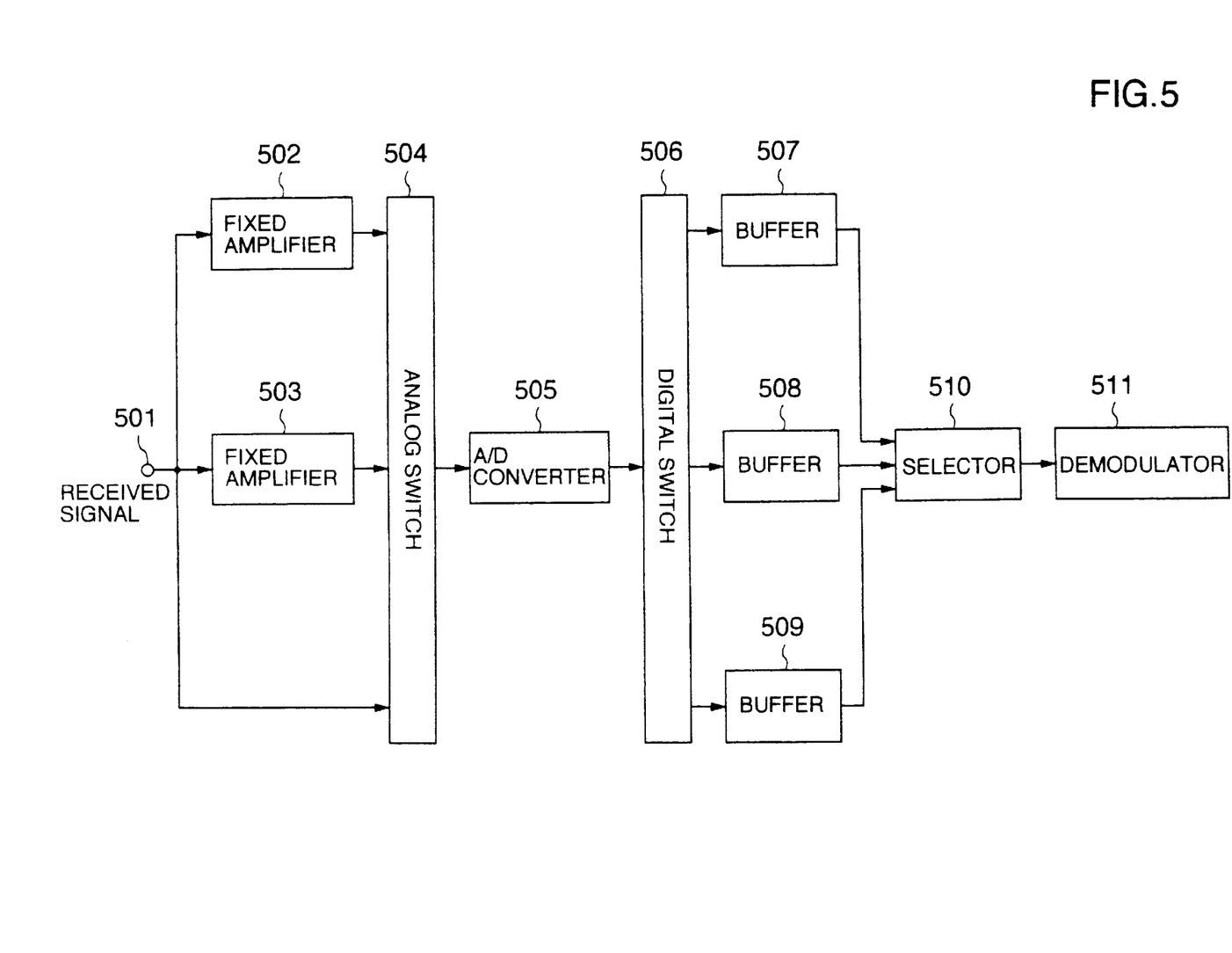
FIG. 5 is a block diagram schematically illustrating an A/D conversion apparatus according to a fifth embodiment of the present invention.

FIG. 5 schematically illustrates an A/D conversion apparatus according to a fifth embodiment of the present invention. In FIG. 5, numeral 501 denotes a received signal, 502 and 503 fixed amplifiers for amplifying the received signal 501 with different amplification factors, respectively, 504 an analog switch for changing over amplified signals and the received signal 501, 505 an A/D converter for converting the analog signal changed over by the analog switch 504 into a digital signal, and 506 a digital switch for changing over the digital signals converted by the A/D converter 505. Numerals 507, 508 and 509 denote buffers for temporarily storing the signals changed over by the digital switch 506. Numeral 510 denotes a selector for selecting, from signals produced from the buffers 507, 508 and 509, a signal from which the demodulation performance is attained most satisfactorily, and 511 a demodulator for demodulating the selected signal.

Operation of the fifth embodiment is now described. The fifth embodiment is different from the first embodiment shown in FIG. 1 in that the received signal 501 and the signals amplified by the amplifiers 502 and 503 having the different amplification factors are converted into the digital signals by the single A/D converter 505 while being changed over by means of the analog switch 504 and are distributed into the corresponding buffers 507, 508 and 509 by means of the digital switch, respectively.

In the fifth embodiment, the received signal 501 is converted into three kinds of different levels by way of example, while the number of levels is not limited thereto and any number of levels may be used. For example, it is assumed that the fixed amplifier 502 has the amplification factor of 40 dB and the fixed amplifier 503 has the amplification factor of 20 dB. In this example, the input signals supplied to the A/D converter 505 are changed over by means of the analog switches 504 to thereby sample the input signals in the time division manner and the output signals produced from the A/D converter 505 are distributed into the buffers 507, 508 and 509 by means of the digital switch 506 in synchronism with the output signals of the A/D converter 505 to thereby reduce the number of the A/D converter 505. When the received signal 501 has a large level, the signals amplified by the fixed amplifiers 502 and 503 are saturated in the A/D converter 505 and the satisfactory receiving performance cannot be obtained even if the amplifiers having the above data are used, while the signal which is not amplified is not saturated and the satisfactory receiving performance is obtained. On the contrary, when the received signal 501 has a small level, the signal amplified by the fixed amplifier 503 and the signal which is not amplified are not saturated in the A/D converter 505, while since the quantized error is too large, the satisfactory demodulation performance cannot be obtained. However, the signal amplified by the fixed amplifier 502 is sampled with sufficient accuracy and since the quantized error is small, the satisfactory demodulation performance is obtained. When the received signal 501 has an intermediate level between the above two levels, the signal amplified by the fixed amplifier 503 becomes an optimum signal. The sampled signal from which the demodulation performance is judged to be drawn out most satisfactorily is selected to be supplied to the demodulator 511, which perform the demodulation.

As described above, according to the fifth embodiment, since the received signal is amplified by the amplifiers with different amplification factors and the amplified signals are converted into the digital signals while being changed over by means of the analog switch 505, the number of A/D converters can be reduced, so that the inexpensive A/D conversion apparatus can be realized. In the embodiment, while the number of A/D converters is one, when a number of fixed amplifiers are used, the number of fixed amplifiers can be increased to the irreducible minimum.

According to the present invention, as apparent from the above embodiments, when the received level is varied largely as in the mobile communication, the satisfactory demodulation performance can be obtained even for a suddenly produced burst signal regardless of the conditions of the line, and the amount of calculations, such as data conversion calculations upon processing of signals can be reduced. There can be realized an inexpensive and excellent A/D conversion apparatus having no deterioration due to conversion of data.

What is claimed is:

1. An A/D conversion apparatus comprising a plurality of amplifiers for amplifying a received signal with different amplification factors, a plurality of A/D converters for A/D converting amplified signals from said amplifiers and the received signal, a selector for selecting a signal, in accordance with an accuracy standard, from among sampled signals output by the A/D converters, and a demodulator for demodulating the selected signal.

2. An A/D conversion apparatus according to claim 1, further comprising maximum value detectors and buffers connected in parallel to each other between respective ones of said A/D converters and said selector, wherein said selector selects said signal from said sampled signals in accordance with A/D converted maximum values.

3. An A/D conversion apparatus according to claim 1, further comprising absolute value calculators and logical sum calculators connected in series between respective ones of said A/D converters and said selector and buffers connected in parallel to said series connection circuits, wherein said selector selects said signal from among said sampled signals in accordance with logical sums of absolute values of the A/D converted signals.

4. An A/D conversion apparatus according to claim 1, further comprising amplitude comparators connected in parallel to said A/D converters and buffers connected between respective ones of said A/D converters and said selector, wherein said selector selects said signal from among said sampled signals in accordance with levels of signals which are not A/D converted.

5. An A/D conversion apparatus according to claim 1, wherein said signals output by said A/D converters and said selected signal have the same bit resolution.

6. An A/D conversion apparatus comprising a plurality of amplifiers for amplifying a received signal with different amplification factors, at least one A/D converter for A/D converting amplified signals from said amplifiers and the received signal while changing over said amplified signals by means of an analog switch, a plurality of buffers for temporarily storing A/D converted signals while changing over said amplified signals by means of a digital switch, a selector for selecting a signal, in accordance with a demodulation performance standard, from among signals produced by said buffers, and a demodulator for demodulating the selected signal.

* * * * *